United States Patent [19]

Davis

[11] 4,253,230

[45] Mar. 3, 1981

[54] SILICON BARRIER JOSEPHSON JUNCTION CONFIGURATION

[75] Inventor: Kenneth L. Davis, Alexandria, Va.

[73] Assignee: The United States of America as represented by the Secretary of the Navy, Washington, D.C.

[21] Appl. No.: 10,859

[22] Filed: Feb. 9, 1979

[51] Int. Cl.³ .............................................. B01J 17/00
[52] U.S. Cl. ...................................... 29/580; 29/589; 29/590; 29/599; 357/5
[58] Field of Search ................. 29/599, 580, 589, 590; 357/5

[56] References Cited

U.S. PATENT DOCUMENTS

| | | | |
|---|---|---|---|
| 3,522,492 | 8/1970 | Pierce | 29/599 |
| 3,911,333 | 10/1975 | Notarys | 357/5 |
| 4,025,844 | 5/1977 | Deutscher | 357/5 |
| 4,064,029 | 12/1977 | Wu | 29/599 |

Primary Examiner—W. C. Tupman
Attorney, Agent, or Firm—R. S. Sciascia; William T. Ellis; Melvin L. Crane

[57] ABSTRACT

A planar, silicon barrier, Josephson junction and method of forming the junction which does not require expensive high-resolution, lithography techniques such as electron beam or x-ray. The method includes an etching mask-etch process which forms the basic structure configuration using a (110)-cut silicon wafer. Subsequent to the etching process the mask is removed and a superconducting film is deposited on the previously formed silicon surface to produce a single crystal silicon barrier with good electrical properties.

19 Claims, 13 Drawing Figures

SILICON BARRIER JOSEPHSON JUNCTION CONFIGURATION

BACKGROUND OF THE INVENTION

This invention relates to Josephson junction devices and more particularly to a single-crystal, silicon barrier, Josephson junction and method of making same.

Heretofore various processes have attempted to make Josephson junctions by use of semiconductors. A number of these processes have made use of deposited semiconductor films which have resulted in devices with very low current density and nonreproducible properties. Deposited films usually end up with pinholes in the deposited barrier and since the films are either amorphous or polycrystalline, doping cannot be adequately controlled.

Josephson junctions with good electrical performance have been processed by use of bulk silicon barriers. One such configuration is made from a silicon wafer which has been heavily doped on one surface. The silicon is etched away except in the boron doped area and then superconducting films are deposited onto each surface of the boron doped silicon which forms the barrier. This structure has the disadvantage that a large wafer area is used for each junction and the junction contacts are on opposite sides of the wafer which makes it almost impossible to fabricate superconducting integrated circuits or Josephson junction detector arrays.

In another configuration, a strip of superconducting film is deposited onto a silicon substrate. A break is then formed across the superconducting film so that the only conduction path across the break is through the silicon substrate; therefore, the tunneling barrier is single-crystal silicon. This configuration is compact and planar so that integrated circuits and detector arrays are feasible. However, the break in the superconducting film must have a very narrow width approximating 1000 Å to 3000 Å and these line widths require electron beam or other high-resolution lithography.

Solutions suitable for etching silicon have been set forth in an article "The Etching of Deep Vertical-walled Patterns in Silicon", by A. T. Stoller, RCA Review, pp. 271-275, June 1970. This article also sets forth that vertical walls may be formed by properly oriented single-crystal silicon. Another article, "Ethylene Diamine-Pyrocatechol-Water Mixture Shows Etching Anomaly in Boron-Doped Silicon", by Å. Bohg, J. Electrochemical Society, Vol. 118, No. 2, pages 401-402, 1971, reports another solution for etching silicon. The latter article sets forth that silicon doped with a concentration of boron greater than $7 \times 10^{19} cm^{-3}$ resisted etching by the solution.

SUMMARY OF THE INVENTION

This invention provides a simple inexpensive method for forming structures which are suitable for superconducting integrated circuits or Josephson junction detector arrays. A single crystal of silicon is used to fabricate the structure by an etch-oxidation method by which the desired configuration is developed. Superconducting films deposited on the shaped single-crystal silicon completes the basic structure.

DETAILED DESCRIPTION

Figure 1A:
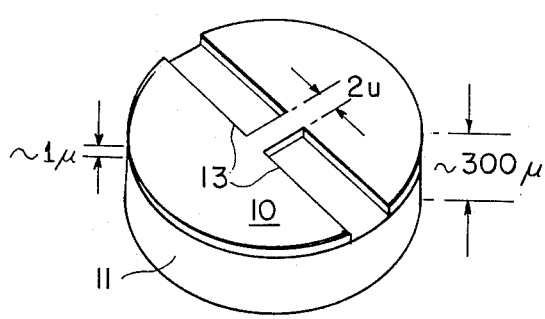
FIGS. 1a through 1h illustrates the steps of one method used to fabricate a planar, silicon barrier, Josephson junction.
Figure 1B:
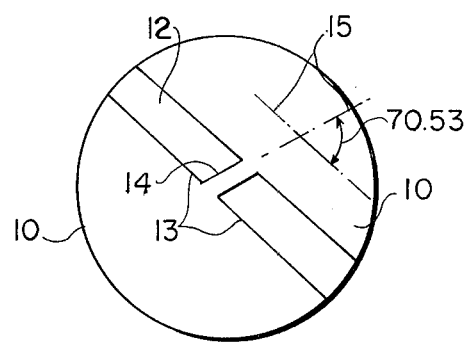
Figure 1C:
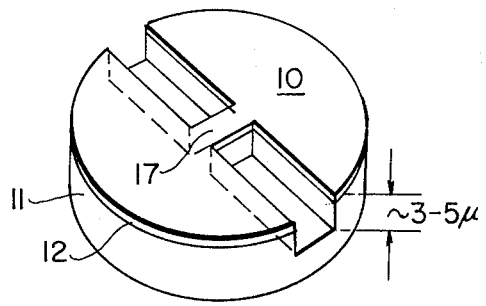

One method of carrying out this invention is illustrated by use of FIGS. 1a–h which illustrate the various steps of the method. A thermal oxide 10 of $SiO_2$ having a thickness of about $1\mu$ is grown on one surface of a silicon wafer 11 with a (110) planar surface 12. Alternatively, a layer of silicon nitride ($Si_3H_4$) having a thickness of about $0.1\mu$ is deposited on the surface of the silicon wafer. As shown in FIG. 1a, an etch-pattern 13 having a width in the range $2-100\mu$ (this width is arbitrary and can be designed to be the desired width of the junction) is formed in the oxide layer to expose the silicon surface 12 by any well known photolithographic process which leaves a central strip 14 of $SiO_2$ having a width of about $2\mu$ or less. The edges of the etch pattern 13 must be aligned along the directions 15, FIG. 1b, in which (111) crystal planes intersect at right angles with the (110) crystal surface 12. These two directions are separated by an angle of 70.53 degrees, as shown in FIG. 1b which is a top view of the silicon surface. Using the oxide pattern as an etch mask, the silicon is etched with an orientation-dependent etch such as KOH and water, which leaves separate channels with smooth vertical walls of from $3-5\mu$ (an arbitrary value) depth with smooth bottom surfaces as shown in FIG. 1c. The smooth vertical walls are (111) planes.

Figure 1D:
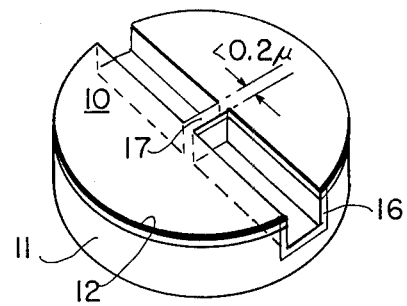

The exposed silicon is then carefully oxidized 16 by controlling the oxidation time and temperature in order to leave a final thickness of the silicon barrier 17 of $<0.2\mu$, as shown in FIG. 1d. For every $1\mu$ of $SiO_2$ which is thermally grown, $0.443\mu$ of silicon is consumed from the exposed surfaces. Thus, if the barrier 17 thickness before oxidation is $2\mu$, growing $2.1\mu$ of thermal oxide would consume $2.1\mu \times 0.443 = 0.930\mu$ of silicon from each side of the barrier so that the barrier 17 thickness would be reduced to $0.14\mu$. Thermal oxidation times and temperatures for silicon are well known and previously tabulated. For example, at a temperature of 1100° C. it takes 80 minutes to grow about $0.78\mu$ of $SiO_2$ in steam on the (111) silicon surface. (The sides of the barrier 17 are (111) surfaces).

Figure 1E:
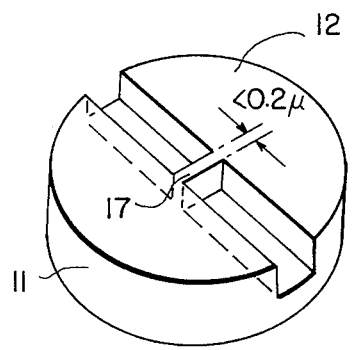
Figure 1F:
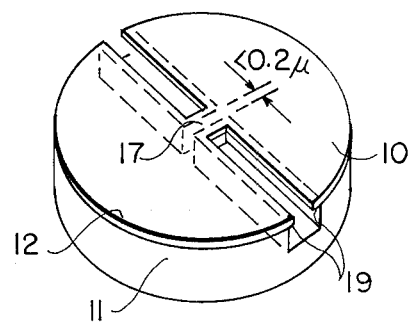

Subsequent to oxidizing the previously etched silicon surfaces, the $SiO_2$ layer and the oxidized surfaces are etched away with an etching solution such as buffered HF that does not attack the silicon. The resulting structure is shown in FIG. 1e. At this stage a p- or n-type impurity can be diffused into the silicon in order to achieve a desired doping level. Alternatively, since the Josephson junction performance is affected significantly only by impurities diffused into the barrier region 17, it may be desirable to do the diffusion process on the structure shown by FIG. 1c rather than the FIG. 1e structure. In this case, the protecting oxide film 10 prevents diffusion of impurities into the (110) surface 12. The doping level will be modified only in the region which has been etched by the orientation-dependent etch.

If the layer 10 is $Si_3N_4$ rather than $SiO_2$, the etch used to remove the thermal oxide 16 does not attack the nitride. In this case, following the oxide etch the structure will look like FIG. 1f which includes a nitride shelf 19 extending beyond the vertical silicon walls. The barrier diffusion can be done on this structure; the nitride layer 10 prevents diffusion of impurities into the (110) surface 12. It is possible to remove the nitride layer with an etching solution such as hot phosphoric acid that does not attack the silicon. After the nitride layer has been removed, the structure looks like FIG. 1e.

The silicon surface is then cleaned to remove all silicon oxide by one of several well known techniques, such as: heating the wafer to approximately 1200° C. in vacuum, bombarding the wafer surface in vacuum with a low energy ion beam, and annealing at approximately 900° C. to remove the damage caused by the ion bombardment, or chemically etching the surface and immediately placing the wafer in vacuum. These cleaning procedures insure that no more than about 6 Å of oxide grows on the exposed silicon surfaces.

Figure 1G:
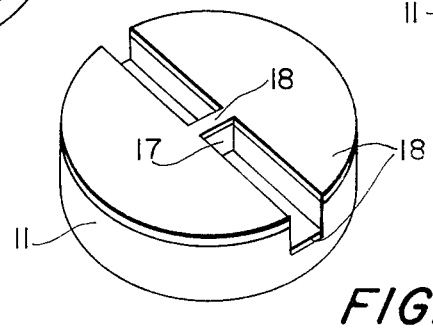

A super conducting film 18 such as lead, indium, tin, niobium or any other suitable superconductor material of a thickness nominally less than about 1$\mu$ is then deposited on the silicon surface (of the FIG. 1e structure) including the top of the barrier as shown in FIG. 1g. The superconducting film is not continuous across the thin silicon barrier 17 since the barrier sides are vertical. The thickness of the deposited film is much less than the height of the barrier and the film is not deposited on the vertical surfaces. Alternatively, the superconducting film may be depostied onto the surface of the structure shown by FIG. 1f. The nitride shelf 19 insures that the superconducting film will not be continuous across the barrier, even for sputtered films such as niobium, since no film will be deposited on the underside of the shelf.

Figure 1H:
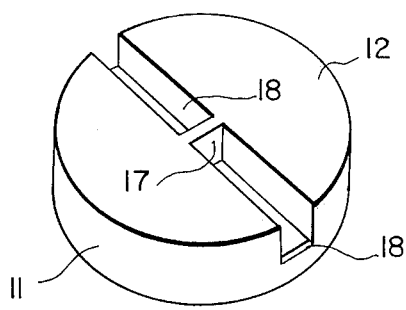

After depositing the superconductor, a pattern is defined by any well-known photolithographic process and the superconducting film 18 is etched off the silicon surface 12 leaving the superconductor film only along the bottom of the etched channel 20. The superconducting film on top of the barrier may or may not be removed since it serves no beneficial purpose. Thus, the finished configuration is as shown in FIG. 1h. A strip of superconducting film in the channels is broken by the vertical silicon barrier. The barrier is sufficiently thin that Josephson tunneling will take place through the thin region of single crystal silicon from one side of the superconducting strip to the other. The fragment of superconductor on top of the barrier does not affect the electrical properties of the Josephson junction. It can be removed if desired by etching briefly using an etchant which attacks silicon but not the superconductor.

Figure 2A:
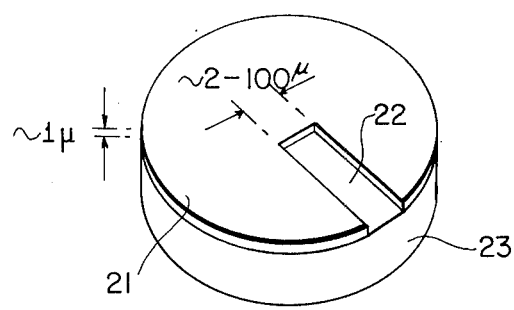
FIGS. 2a through 2e illustrate the steps of a second method used to fabricate a planar, silicon barrier, Josephson junction.
Figure 2B:
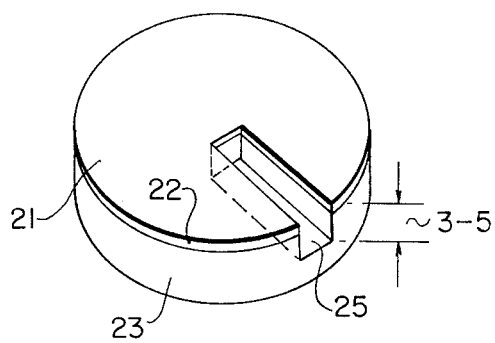
Figure 2C:
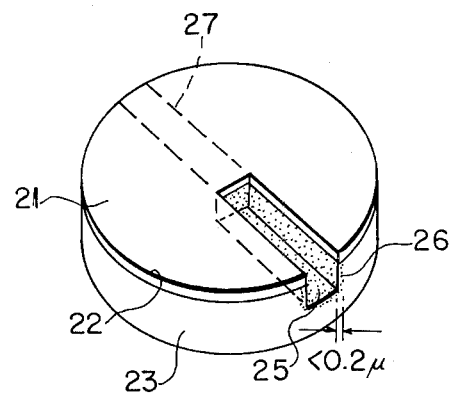
Figure 2D:
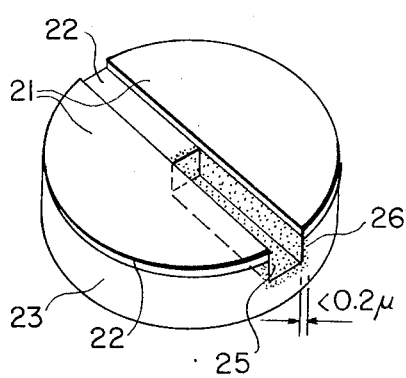
Figure 2E:
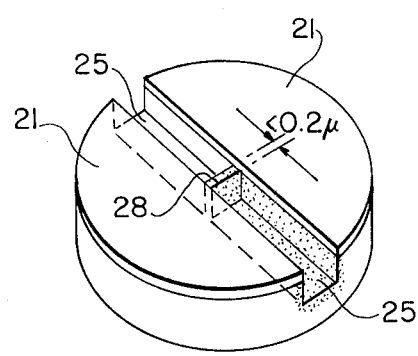

An alternative method may be used to fabricate a single crystal silicon barrier Josephson junction which makes use of boron doping, as shown by FIGS. 2–2e. An oxide layer 21 of $SiO_2$ is formed on the (110) plane surface 22 of a single crystal silicon wafer 23. Alternatively, a layer of silicon nitride may be deposited on the surface of the silicon wafer. An etch pattern 24 is formed in the oxide layer to expose the silicon surface 22 as shown in FIG. 2a. The silicon surface exposed by the pattern is etched with an orientation-dependent etch such as KOH and water to form a step 25 in one side of the silicon wafer as shown in FIG. 2b. The straight lines of the pattern across the silicon wafer are oriented parallel to the two sets of (111) planes that intersect the (110) surfaces vertically, as explained in the discussion of FIG. 1b. In this orientation the sides of the step will be straight, smooth, and vertical.

Subsequent to forming the step in the silicon wafer, the exposed silicon of step 25 is doped 26 heavily with boron using any well-known method, as shown in FIG. 2c. The boron is diffused to a desired depth 0.2$\mu$ and has a concentration greater than $7\times10^{19}cm^{-3}$, which is sufficient to resist etching by an ethylene diamine-pyrocatechol-water silicon etchant. After the silicon step 25 has been doped with boron, the $SiO_2$ layer 21 is patterned as shown by dotted lines 27 (FIG. 2c) and etched away to expose the silicon surface 22, as shown in FIG. 2d. The silicon outlined by pattern 27 is then etched down to a level which is even with the step surface 25 to form a second step 25 as shown in FIG. 2c. Since the silicon etch does not attach the boron doped areas of the single crystal wafer, the central upright boron doped section 28 forms the Josephson junction barrier. The silicon doping can be modified, if desired, prior to depositing the superconducting film as set forth for Example 1. The $SiO_2$ layer 21 is then etched away leaving the structure shown in FIG. 2e. The remaining fabrication is the same as previously mentioned in the example set forth for FIG. 1. After deposition of the superconductor film, the structure looks like FIG. 1g, and after defining and etching a pattern in the superconductor film the structure looks like FIG. 1h. The two different methods of forming a silicon-barrier Josephson junction produce the same end structure.

Obviously many modification and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of forming a planar, silicon barrier, Josephson junction comprising:
   fabricating from a silicon bulk material a single crystal of silicon having a (110)-cut surface;
   growing or depositing a protective layer on the (110)-cut surface of said silicon wafer;
   forming an etch pattern in said protective layer to expose a portion of the surface of said silicon wafer;
   etching away the exposed silicon defined by said pattern to a desired depth thereby forming a channel on opposite sides of a silicon barrier said channel having smooth straight side surfaces with a smooth bottom of exposed silicon in the surface of said wafer;
   oxidizing said exposed silicon surfaces to a desired thickness;
   etching away all the oxidized areas thereby forming a narrow barrier of a desired thickness;
   cleaning all oxide off the silicon barrier surfaces;
   depositing a layer of superconducting film on the bottom of said channel and on top of said wafer surface;
   forming an etch pattern on said superconducting layer to remove the superconductor film from the top of said wafer surface thereby completing the formation of said Josephson junction.

2. A method as claimed in claim 1 in which:
said protective layer is silicon dioxide ($SiO_2$).

3. A method as claimed in claim 1 in which:
said protective layer is silicon nitride ($Si_3N_4$).

4. A method as claimed in claim 2 wherein:

said silicon is etched away with a KOH and water mixture.

5. A method as claimed in claim 3 wherein:
said silicon is etched away with a KOH and water mixture.

6. A method as claimed in claim 1 in which:
said superconducting film is selected from one of the following: lead, indium, tin or niobium.

7. A method as claimed in claim 1 which includes:
doping said silicon with impurities subsequent to forming said channels and said barrier, said doping being done prior to oxidizing said exposed silicon surfaces.

8. A method as claimed in claim 1 which includes:
doping said silicon with impurities subsequent to etching away said oxidized areas, said doping being done prior to cleaning said silicon barrier surfaces.

9. A method as claimed in claim 3 in which:
said silicon nitride is etched away subsequent to etching away all the oxide areas and prior to cleaning all oxide off the silicon barrier surface.

10. A method as claimed in claim 3 in which:
said silicon nitride is etched away subsequent to depositing said superconducting film on the bottom of said channel.

11. A method for forming a planar, silicon barrier, Josephson junction comprising:
fabricating from a silicon bulk material a single crystal of silicon having a (110)-cut surface;
growing or depositing a protective layer on the (110)-cut surface of said wafer;
forming an etch pattern in said protective layer to expose a portion of the surface of said silicon wafer;
etching away the exposed silicon defined by said pattern, using first etchant, to a desired depth forming a channel having smooth vertical surfaces and a smooth flat bottom surface;
doping the exposed silicon surfaces with boron in which the dopant diffuses to a controlled depth within the exposed silicon;
forming an etch pattern in said protective layer to expose a second portion of the surface of said silicon wafer directly opposite said doped channel;
etching the second exposed surface of said silicon using a second etchant, to a level coplanar with the surface of the boron-doped layer in the bottom surface of said channel thereby leaving stand a doped front upright portion which is perpendicular to the wafer surface;
cleaning all oxide off the exposed silicon surfaces;
depositing a layer of superconducting film on the surface of said silicon wafer and on the bottom of said channels; and
forming an etch pattern on said superconducting layer to remove the superconductor film from the top of said wafer, thereby completing the formation of said Josephson junction.

12. A method of forming a planar, silicon barrier, Josephson junction as claimed in claim 7 in which:
said protective layer on said silicon surface is silicon dioxide ($SiO_2$).

13. A method of forming a planar, silicon barrier, Josephson junction as claimed in claim 11 in which:
said protective layer on said silicon surface is silicon nitride ($Si_3N_4$).

14. A method as claimed in claim 12 in which:
said first etchant is a KOH and water mixture.

15. A method as claimed in claim 13 in which:
said first etchant is a KOH and water mixture.

16. A method as claimed in claim 12 wherein:
said first etchant is an ethylene diamine-pyrocatechol-water mixture.

17. A method as claimed in claim 14 wherein:
said second etchant is an ethylene diamine-pyrocatechol-water mixture.

18. A method as claimed in claim 15 wherein:
said second etchant is an ethylene diamine-pyrocatechol-water mixture.

19. A method as claimed in claim 11 which includes:
doping said silicon with impurities after said silicon surface has been etched with said second etchant and before said silicon barrier surfaces are cleaned.

* * * * *